(12) United States Patent
Kim

(10) Patent No.: US 12,159,890 B2
(45) Date of Patent: Dec. 3, 2024

(54) IMAGE SENSOR

(71) Applicant: SAMSUNG ELECTRONICS CO., LTD., Suwon-si (KR)

(72) Inventor: Jung Hye Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/103,582

(22) Filed: Jan. 31, 2023

(65) Prior Publication Data

US 2023/0326945 A1  Oct. 12, 2023

(30) Foreign Application Priority Data

Apr. 7, 2022  (KR) ........................ 10-2022-0043143

(51) Int. Cl.
*H01L 27/146* (2006.01)
*H04N 25/772* (2023.01)

(52) U.S. Cl.
CPC .... *H01L 27/1463* (2013.01); *H01L 27/14612* (2013.01); *H01L 27/14636* (2013.01); *H04N 25/772* (2023.01)

(58) Field of Classification Search
CPC ........... H01L 27/1463; H01L 27/14612; H01L 27/14636; H04N 25/772
See application file for complete search history.

(56) References Cited

U.S. PATENT DOCUMENTS

| | | | |
|---|---|---|---|
| 9,954,018 B2 | 4/2018 | Yamaguchi | |
| 9,961,284 B2 | 5/2018 | Koga | |
| 10,341,591 B2 | 7/2019 | Hirase et al. | |
| 10,734,431 B2 | 8/2020 | Lee | |
| 10,840,279 B2 | 11/2020 | Kwag | |
| 2020/0176500 A1* | 6/2020 | Sze | H01L 27/14614 |
| 2021/0258520 A1 | 8/2021 | Kobayashi | |

FOREIGN PATENT DOCUMENTS

KR  10-2018-0076845 A  7/2018

* cited by examiner

*Primary Examiner* — Tony Ko
(74) *Attorney, Agent, or Firm* — Sughrue Mion, PLLC

(57) ABSTRACT

An image sensor is provided. The An image sensor includes: a first substrate including a first side and a second side opposite to each other, and an active region; a plurality of pixel regions, each including a photoelectric conversion layer on the first side of the first substrate; a pixel isolation pattern which separates the plurality of pixel regions from each other and extends along a direction perpendicular to the first side of the first substrate; and a first transistor, a second transistor and a third transistor corresponding to a first pixel region of the plurality of pixel regions. The first transistor, the second transistor and the third transistor share a common source/drain region inside the active region.

20 Claims, 13 Drawing Sheets

IMAGE SENSOR

This application claims priority from Korean Patent Application No. 10-2022-0043143 filed on Apr. 7, 2022 in the Korean Intellectual Property Office, the disclosure of which is incorporated by reference herein in its entirety.

BACKGROUND

1. Field

The present disclosure relates to an image sensor.

2. Description of Related Art

An image sensing device may include a semiconductor element that converts optical information into an electric signal. Such an image sensing device may include a charge coupled device (CCD) image sensing device and/or a complementary metal-oxide semiconductor (CMOS) image sensing device.

The CMOS image sensor may be abbreviated as a CIS (CMOS image sensor). The CIS may include a plurality of pixels arranged two-dimensionally. Each of the pixels may include, for example, a photodiode PD. The photodiode may serve to convert incident light into electrical signals.

Recently, with development of the computer industry and the telecommunication industry, demands for image sensing device having improved performance and small size have also increased in various fields. For example, the image sensing device may be implemented in various devices, such as a digital camera, a video camera, a smart phone, a game console, a security camera, a medical micro camera, and a robot. To provide the improved performance and small size, there is a need for a highly integrated semiconductor elements that are highly scaled in the image sensing device is conducted, and patterns of the semiconductor elements has a fine width and may be spaced at a fine pitch.

SUMMARY

Aspects of the present disclosure provide an image sensor having improved performance and reliability.

According to an embodiment, an image sensor includes: a first substrate including a first side and a second side opposite to each other, and an active region; a plurality of pixel regions, each including a photoelectric conversion layer on the first side of the first substrate; a pixel isolation pattern which separates the plurality of pixel regions from each other and extends along a direction perpendicular to the first side of the first substrate; and a first transistor, a second transistor and a third transistor corresponding to a first pixel region of the plurality of pixel regions. The first transistor, the second transistor and the third transistor share a common source/drain region inside the active region.

According to an embodiment, an image sensor includes: a substrate including an element isolation region and an active region; a plurality of pixel regions provided on the substrate, each including a photoelectric conversion layer, a floating diffusion region, a transfer transistor and a plurality of source follower transistors electrically connected to the floating diffusion region; and a pixel isolation pattern that penetrates the substrate and separates the plurality of pixel regions from each other. Source regions of the plurality of source follower transistors are respectively connected to a plurality of source contacts, and a common drain region shared by the plurality of source follower transistors is connected to a common drain contact.

According to an embodiment, an image sensor includes: a first substrate including a first side and a second side opposite to each other, and an active region; pixels which are provided in the first substrate and includes a photoelectric conversion layer, a floating diffusion region, and a transfer transistor configured to electrically connect the photoelectric conversion layer and the floating diffusion region; a pixel isolation pattern that extends into the first substrate and separates each of the pixels from each other; a microlens provided on the second side of the first substrate; a second substrate provided on the first side of the first substrate, and including a fourth side facing the first side of the first substrate and a third side opposite to the fourth side; a plurality of source follower transistors connected to the floating diffusion region, on the fourth side of the second substrate; a third substrate provided on the third side of the second substrate; and a plurality of logic circuits configured to control the plurality of source follower transistors on the third substrate. The plurality of source follower transistors share a common drain region inside the active region.

However, aspects of the present disclosure are not restricted to those set forth herein.

BRIEF DESCRIPTION OF THE DRAWINGS

The above and other aspects and features will be more clearly understood from the following description, taken in conjunction with the accompanying drawings, in which.

DETAILED DESCRIPTION

Hereinafter, example embodiments are described in conjunction with the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
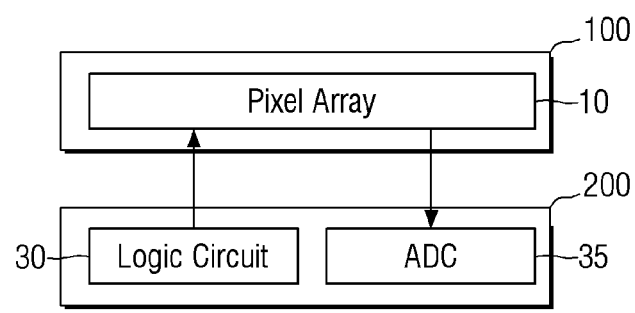
FIG. 1 is a block diagram of an image sensor according to some example embodiments.

FIG. 1 is a block diagram of an image sensor according to some example embodiments.

Referring to FIG. 1, the image sensor according to some example embodiments may include a first semiconductor chip 100 and a second semiconductor chip 200. The first semiconductor chip 100 and the second semiconductor chip 200 may be arranged to overlap each other from a planar viewpoint. The first semiconductor chip 100 and the second semiconductor chip 200 may be stacked in a vertical direction.

The first semiconductor chip 100 may be referred to as an upper plate, and the second semiconductor chip 200 may be referred to as a lower plate. In this case, a photoelectric conversion layer PD, a transfer transistor TX, a reset transistor RX, a source follower transistor SX, a selection transistor AX, and a dual conversion transistor DCX of FIG. 6, which will be described later, may be formed on the first semiconductor chip 100.

The first semiconductor chip 100 may include a pixel array 10. The second semiconductor chip 200 may include a logic circuit 30 and an Analog Digital Converter (ADC) 35. The pixel array 10 may generate electric charges in proportion to an amount of light entering the pixel array 10. Further, the pixel array 10 may convert an optical signal into an electric signal, that is, an analog signal, according to the control of the logic circuit 30. The pixel array 10 may output the analog signal to the ADC 35. The ADC 35 may convert the analog signal into a digital signal. The ADC 35 may provide data based on the digital signal.

Also, the image sensor according to some example embodiments may further include a memory cell array in the second semiconductor chip 200. The memory cell array may store data based on the digital signal.

The data may be image data generated in units of a frame. The number of bits of data may be determined on the basis of resolution of the ADC 35. The number of bits of data may be determined on the basis of whether or what type of High Dynamic Range (HDR) is supported by the image sensor. Further, the bits of data may further include at least one extension bit that represents a generation position of data, information of data, and the like.

In some example embodiments, the second semiconductor chip 200 may further include an embedded processor such as an image signal processor (ISP) and a digital signal processor (DSP), which processes the data output from the pixel array 10. The processor may improve noise of the image data, correct the image, or perform subsequent tasks related to the image output from the pixel array 10.

Figure 2:
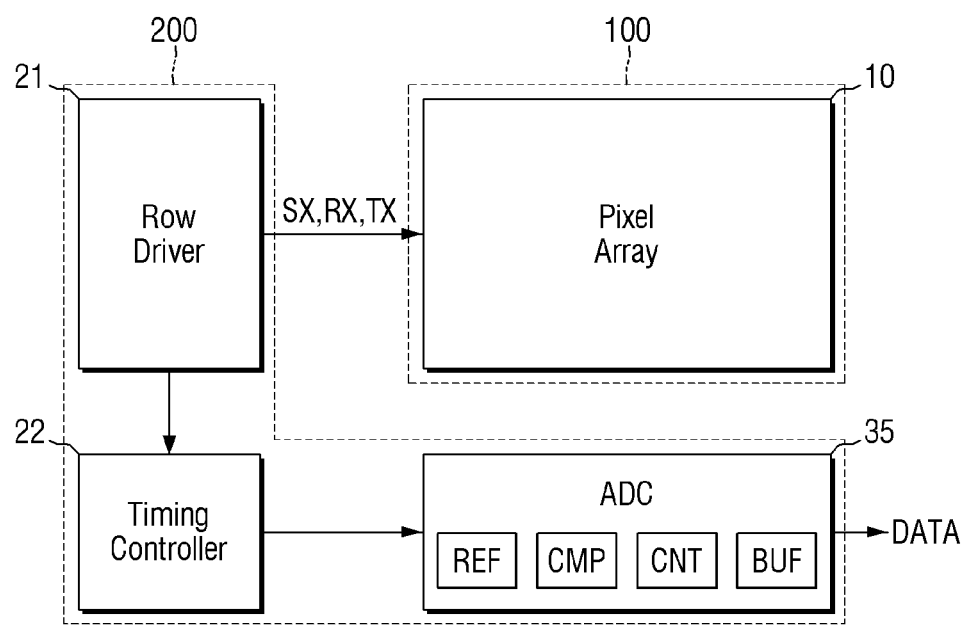
FIG. 2 is a block diagram of a pixel array, logic circuit, and ADC.

FIG. 2 is a block diagram of a pixel array, a logic circuit, and an ADC, such as those discussed above with respect to FIG. 1.

Referring to FIG. 2, the pixel array 10 may be implemented on the first semiconductor chip 100, and row driver 21 and timing controller 22, which are part of the logic circuit 30, as well as the ADC 35, may be implemented on the second semiconductor chip 200.

The pixel array 10 may convert incident light to generate an electrical signal. The pixel array 10 may include unit pixel regions arranged in the form of a matrix along a row direction and a column direction. The pixel array 10 may be driven according to the control of the logic circuit 30. Specifically, the logic circuit 30 may control a plurality of transistors included in the pixel array 10.

The logic circuit 30 may efficiently receive data from the pixel array 10 and generate an image frame. For example, the logic circuit 30 may utilize a global shutter type in which the entire unit pixel regions are simultaneously detected, a flutter shutter type which adjusts an exposure time at which the entire unit pixel regions are simultaneously detected, a rolling shutter type or a coded rolling shutter type which controls the unit pixel regions in units of a row, or the like.

The second semiconductor chip 200 may include the ADC 35 and the logic circuit 30, which includes the row driver 21 and the timing controller.

The row driver 21 may control the pixel array 10 in units of a row according to the control of the timing controller 22. The row driver 21 may select at least one row among the rows of the pixel array 10 according to the row address. The row driver 21 may decode the row address, and may be connected to the selection transistor AX, the reset transistor RX, and the source follower transistor SX. The pixel array 10 may be driven by a plurality of drive signals such as a pixel selection signal, a reset signal, and a charge transfer signal provided by the row driver 21.

The ADC 35 may be connected to the pixel array 10 through a column line COL. The ADC 35 may convert the analog signals received from the pixel array 10 through the column lines COL into digital signals. There may be one or more ADCs 35, and the number of ADCs 35 may be determined on the basis of the number of unit pixel regions provided along one row and the number of column lines COL.

For example, the ADC 35 may include a reference signal generator REF, a comparator CMP, a counter CNT, and a buffer BUF. The reference signal generator REF may generate a ramp signal having a specific slope, and provide the ramp signal as a reference signal of the comparator. The comparator CMP may compare the analog signal with the ramp signal of the reference signal generator REF, and output comparison signals each having transition points according to a valid signal component. The counter CNT may perform a counting operation to generate a counting signal and provide the counting signal to the buffer BUF. The buffer BUF includes latch circuits each connected to the column line COL, and may latch the counting signal, which is output from the counter CNT in response to the transition of the comparison signal for each column, and output the latched counting signal as data.

In some example embodiments, the logic circuit 30 may further include correlated double sampling (CDR) circuits that obtain a difference between a reference voltage representing a reset state of the unit pixel regions and an output voltage representing the signal component corresponding to the incident light to perform correlated double sampling, and output an analog sampling signal corresponding to effective signal component. The correlated double sampling circuits may be connected to the column lines COL.

The timing controller 22 may control the operation timing of the row driver 21 and the ADC 35. The timing controller 22 may provide the timing signal and the control signal to the row driver 21 and the ADC 35. More specifically, the timing controller 22 may control the ADC 35, and the ADC 35 may provide data to the logic circuit 30 according to the control of the timing controller 22. Further, the timing controller 22 may further include circuits that provide a request, a command or an address to the logic circuit 30 so that the data of the ADC 35 is stored in the memory cell array.

Figure 3:
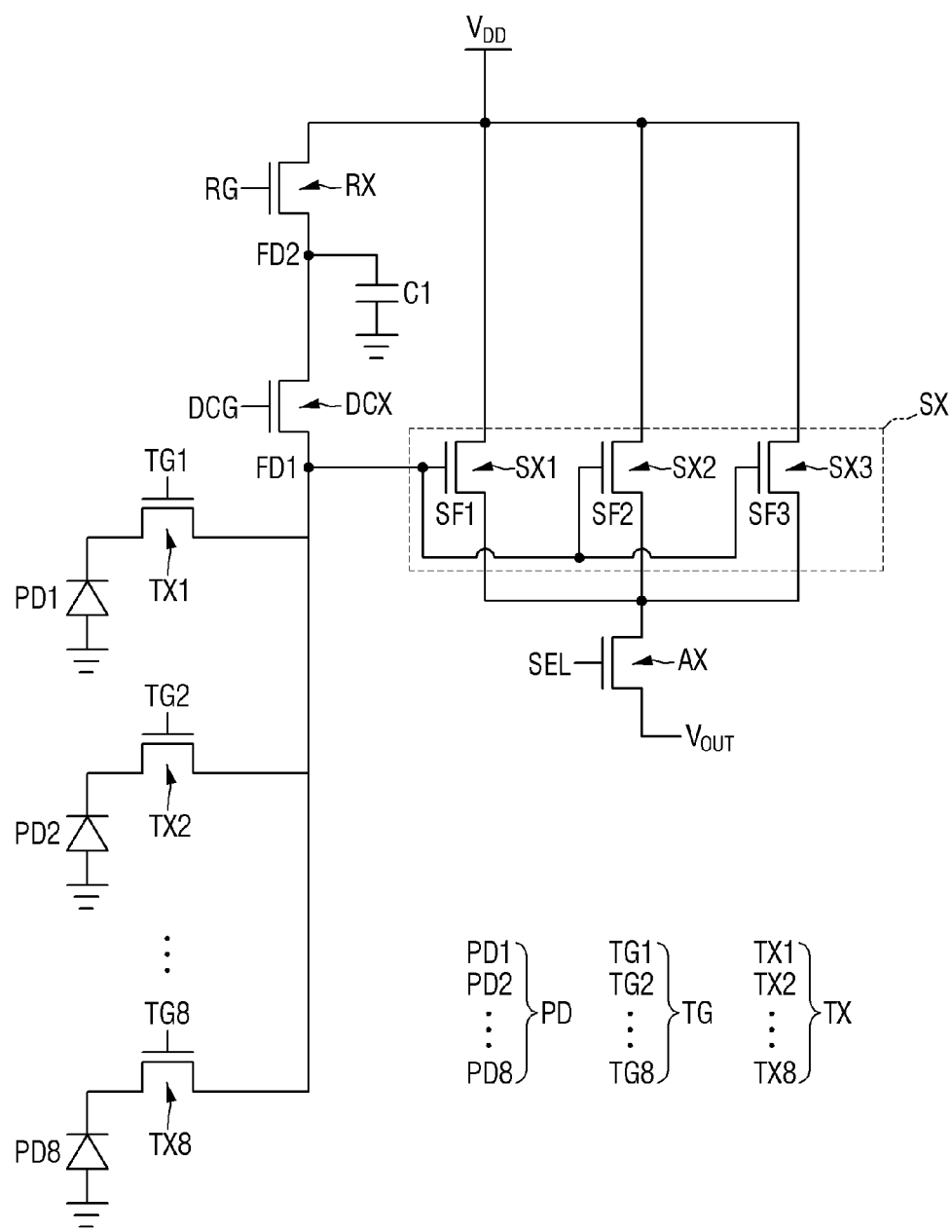
FIG. 3 is a circuit diagram for explaining a unit pixel region.

FIG. 3 is a circuit diagram for explaining a unit pixel region of the pixel array of FIG. 1.

Figure 6:
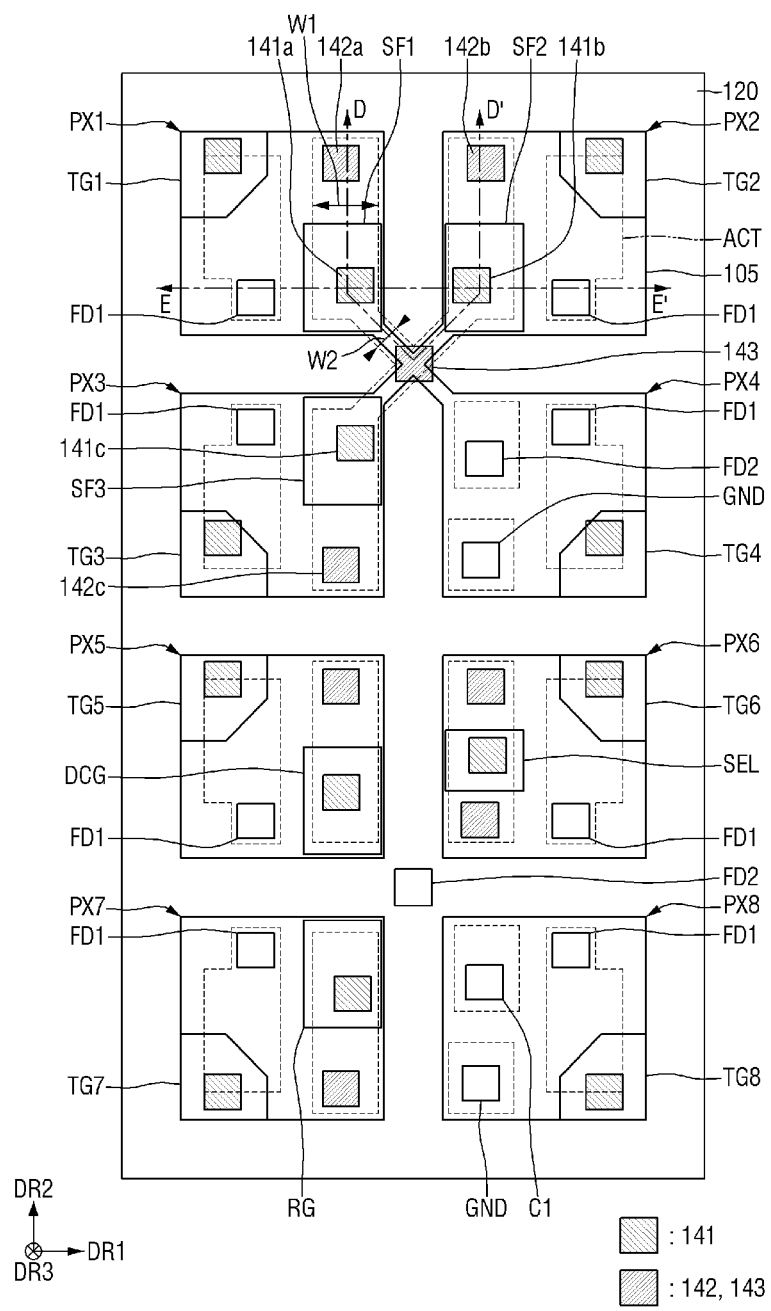
FIG. 6 is a layout diagram which shows schematically a unit pixel region of an image sensor according to some example embodiments.

Referring to FIG. 3, the pixel array may include a photoelectric conversion layer PD, a transfer transistor TX, a floating diffusion region FD (which may include first floating diffusion region FD1 and second floating diffusion region FD2), a reset transistor RX, a source follower transistor SX, a selection transistor AX, and a dual conversion transistor DCX. Referring to FIGS. 3 and 6, the unit pixel region may include a plurality of first to eighth pixel regions PX1 to PX8 including eight photoelectric conversion layers PD connected in parallel. The transfer transistor TX may include a plurality of first to eighth transfer transistors TX1 to TX8 connected in parallel. However, the number of photoelectric conversion layers, the number of pixel regions, and the number of transistors are not limited thereto.

The photoelectric conversion layer PD may generate electric charges in proportion to the amount of light that is incident from the outside. The photoelectric conversion layer PD may be a photodiode including an n-type impurity region and a p-type impurity region. The photoelectric conversion layer PD may be coupled to the transfer transistor TX that transfers the generated and accumulated electric charges to the floating diffusion region FD. Because the floating diffusion region FD is a region for switching the electric charges to voltage, and has a parasitic capacitance, the electric charges may be accumulatively stored.

In some example embodiments, the floating diffusion region FD may include a first floating diffusion region FD1 shared by the photoelectric conversion layer PD, and a second floating diffusion region FD2 connected to the dual conversion transistor DCX to adjust the combined capacitance.

One end of the transfer transistor TX may be connected to the photoelectric conversion layer PD, and the other end of the transfer transistor TX may be connected to the floating diffusion region FD. The transfer transistor TX may be formed of a transistor driven by a predetermined bias, e.g., transfer signals. The transfer signals may be applied through the transfer gates TG. That is, the transfer transistor TX may transfer the electric charges generated from the photoelectric conversion layer PD to the floating diffusion region FD according to the transfer signals.

The source follower transistor SF may amplify a change in electrical potential of the floating diffusion region FD to which the electric charges are sent from the photoelectric conversion element PD and output it to an output line $V_{OUT}$. When the source follower transistor SF is turned on, a predetermined electrical potential provided to a drain of the source follower transistor SF, for example, a power supply voltage $V_{DD}$, may be sent to a drain region of the selection transistor SEL. A plurality of source follower gates SF1, SF2, and SF3 of the source follower transistor SX may be connected to the floating diffusion region FD.

The selection transistor SEL may select a unit pixel region to be read in units of a row. The selection transistor SEL may be made up of a transistor that is driven by a selection line that applies a predetermined bias, e.g., a row selection signal SX. The row selection signal may be applied through the selection gate SEL.

The reset transistor RX may periodically reset the floating diffusion region FD. The reset transistor RX may be made up of a transistor that is driven by a reset line that applies a predetermined bias, e.g., a reset signal. The reset signal may be applied through the reset gate RG. When the reset transistor RX is turned on by the reset signal, a predetermined electrical potential provided to the drain of the reset transistor RX, for example, the power supply voltage $V_{DD}$, may be sent to the floating diffusion region FD.

The dual conversion transistor DCX may adjust the conversion gain. For example, the conversion gain may be adjusted, by applying dual gain signal of a logic high level or applying a dual gain signal of a logic low level to the dual conversion gate of the dual conversion transistor DCX. The dual conversion transistor DCX may be provided between the first floating diffusion region FD1 and the second floating diffusion region FD2. The conversion gain may be adjusted, by adjusting the combined capacitance corresponding to the first and second floating diffusion regions FD1 and FD2 depending on whether the dual conversion transistor DCX is driven.

A wiring structure to be described below may be electrically connected to at least one of the transfer gate TG, the source follower gate SF, the dual conversion gate DCG, the reset gate RG, and the selection gate SEL. The wiring structure may be configured to apply the power supply voltage $V_{DD}$ to the drain of the reset transistor RX or the drain of the source follower transistor SX. The wiring structure may include a column line connected to the selection transistor AX.

Although FIG. 3 shows an example in which eight photoelectric conversion layers PD1 to PD8 electrically share one floating diffusion region FD1, example embodiments are not limited thereto. That is, the number of photoelectric conversion layers PD1 to PD8 that electrically share one floating diffusion region FD1 is not limited to that shown.

Figure 4:
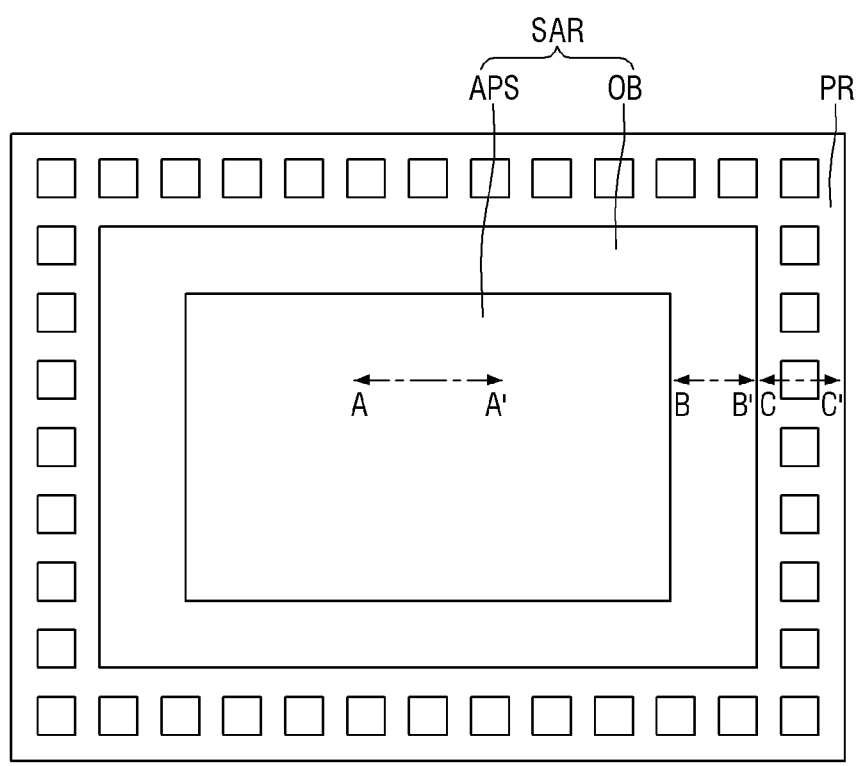
FIG. 4 is a plan view of an image sensor according to some example embodiments.
Figure 4:
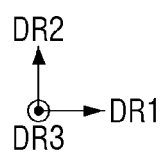
Figure 5:
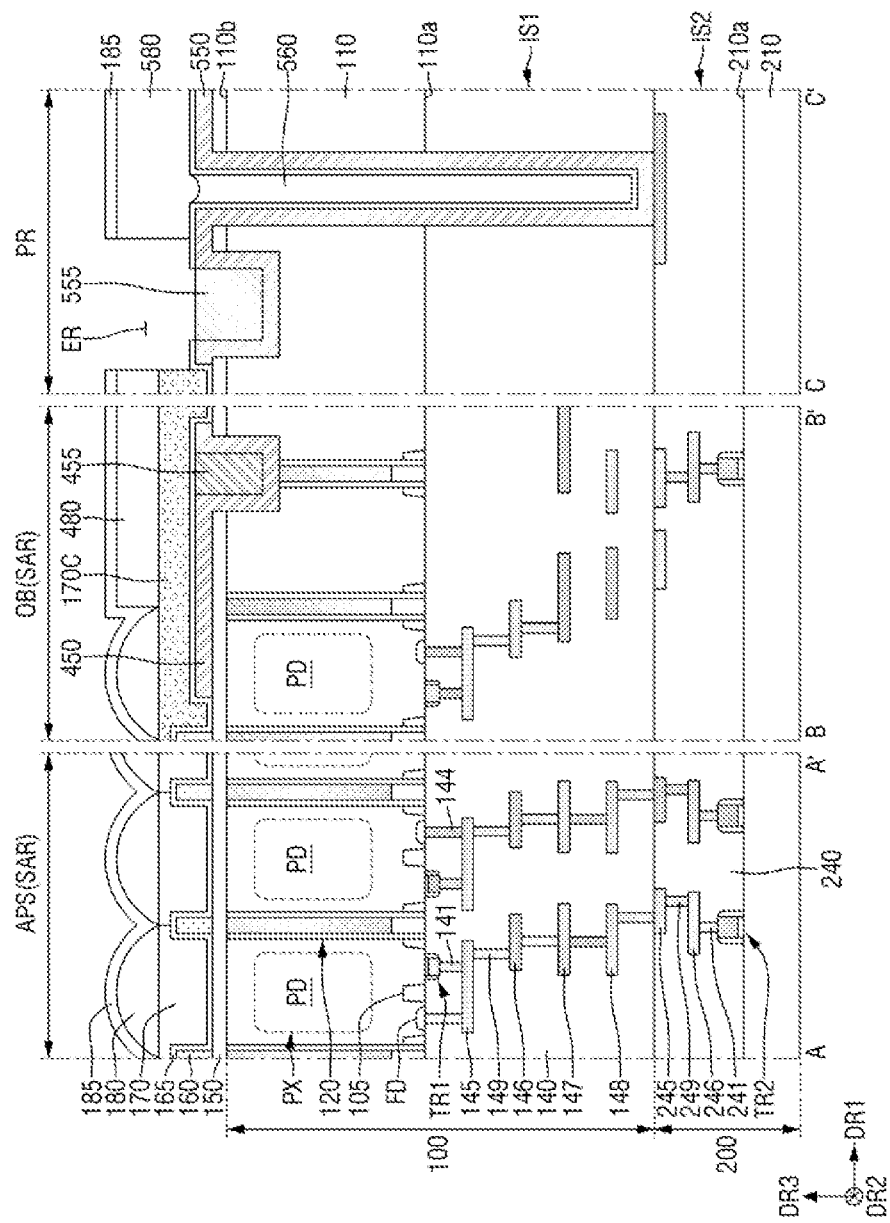
FIG. 5 is a cross-sectional view taken along the lines A-A', B-B' and C-C' of FIG. 4.

FIG. 4 is a plan view of the image sensor according to some example embodiments. FIG. 5 is a cross-sectional view taken along the lines A-A', B-B' and C-C' of FIG. 4.

Referring to FIG. 4, the image sensor according to some example embodiments may include a sensor array region SAR and a pad region PR.

The sensor array region SAR may include a region corresponding to the first pixel array 10 and the second pixel array 20 of FIGS. 1 to 2. For example, a plurality of unit pixels arranged two-dimensionally (for example, in the form of a matrix) may be formed in the sensor array region SAR.

The sensor array region SAR may include a light-receiving region APS and a light-shielding region OB. Active pixels that receive light to generate an active signal may be arranged inside the light-receiving region APS. Optical black pixels that shield light to generate an optical black signal may be arranged in the light-shielding region OB. Although the light-shielding region OB may be formed, for example, along the periphery of the light-receiving region APS, this is merely an example. In some example embodiments, dummy pixels may be formed in the light-receiving region APS adjacent to the light-shielding region OB. Dummy pixels may be pixels that do not generate an active signal.

The pad region PR may be formed around the sensor array region SAR. Although the pad region PR may be formed adjacent to the edge of the image sensor according to some example embodiments, this is only an example. The pad region PR may be connected to an external device or the like and configured to transmit and receive electrical signals between the image sensor according to some example embodiments and the external device.

Referring to FIG. 5, the image sensor according to some example embodiments may include a first substrate 110, a pixel isolation pattern 120, a surface insulating film 150, a first color filter 170, a grid pattern 160, a microlens 180, and a second substrate 210, a first pad pattern 455, and a second pad pattern 555.

The first substrate 110 may be a semiconductor substrate. For example, the first substrate 110 may be bulk silicon or silicon-on-insulator (SOI). The first substrate 110 may be a silicon substrate or may include other substances, for example, silicon germanium, indium antimonide, lead tellurium compounds, indium arsenic, indium phosphide, gallium arsenide or gallium antimonide. Alternatively, the first substrate 110 may have an epitaxial layer formed on a base substrate.

The first substrate 110 may include a first side 110*a* and a second side 110*b* that are opposite to each other. In some example embodiments, the second side 110*b* of the first substrate 110 may be a light-receiving surface on which light is incident. That is, the image sensor according to some example embodiments may be a backside illumination (BSI) image sensor.

A plurality of pixel regions PX may be formed inside the first substrate 110 of the light-receiving region APS and the light-shielding region OB. Each pixel region PX may include a photoelectric conversion layer PD. The first substrate 110 of the light-shielding region OB may include a dummy pixel region that does not include the photoelectric conversion layer PD, but example embodiments are not limited thereto. For example a signal generated in the dummy pixel region may be used as information for removing process noise.

The photoelectric conversion layer PD may be formed in the first substrate 110 of the light-receiving region APS and the light-shielding region OB. The photoelectric conversion layer PD may generate electric charges in proportion to the amount of light that is incident from the outside. The photoelectric conversion layer PD may transfer the generated and accumulated electric charges to the floating diffusion region FD.

The floating diffusion region FD may be formed inside the first substrate 110 of the light-receiving region APS and the light-shielding region OB. The floating diffusion region FD may be formed inside the first substrate 110 along the first side 110*a*. The electric charges transferred to the floating diffusion region FD may be applied to the plurality of source follower gates SF1, SF2, and SF3 of FIG. 3.

The transfer transistor TX may be provided on the first substrate 110. One end of the transfer transistor TX may be connected to the photoelectric conversion layer PD, and the other end of the transfer transistor TX may be connected to the floating diffusion region FD. The transfer transistor TX may transfer the electric charges generated from the photoelectric conversion layer PD to the floating diffusion region FD.

The transfer transistor TX may include a transfer gate, a gate insulating film, and a gate spacer. As an example, the transfer gate may include a portion embedded inside the first substrate 110. The gate insulating film may be provided between the transfer gate and the first substrate 110. The gate spacer may be provided on both side walls of the transfer gate.

The pixel isolation pattern 120 may be formed inside the first substrate 110. The pixel isolation pattern 120 may be formed by embedding an insulating material in a deep trench formed by patterning the first substrate 110. The pixel isolation pattern 120 may penetrate the first substrate 110 in the third direction DR3. For example, the pixel isolation pattern 120 may extend from the first side 110*a* to the second side 110*b*. Such a pixel isolation pattern 120 may be frontside deep trench isolation (FDTI).

For example, the pixel isolation pattern 120 may define a plurality of pixel regions PX and a dummy pixel region. The pixel isolation pattern 120 may be formed in the form of a grid pattern from a planar viewpoint, and separate the plurality of pixel regions PX and the above-mentioned dummy pixel region.

In some example embodiments, the element isolation pattern 105 may be provided. The element isolation pattern 105 may be provided inside the first substrate 110. For example, the element isolation pattern 105 may be provided inside a trench in which a part of the first substrate 110 is recessed. The trench may be recessed from the first side 110*a* of the first substrate 110. The element isolation pattern 105 may be a shallow trench isolation (STI) film.

The width of the element isolation pattern 105 in the second direction DR2 may be gradually decreased from the first side 110*a* to the second side 110*b* of the first substrate 110. The element isolation pattern 105 may overlap the pixel isolation pattern 120 in the second direction DR2 or the first direction DR1. The pixel isolation pattern 120 may penetrate the element isolation pattern 105 in the third direction DR3. The element isolation pattern 105 may include an insulating material. The element isolation pattern 105 may include, for example, at least one of silicon nitride, silicon oxide and silicon oxynitride.

Referring to FIG. 5, the image sensor according to some example embodiments may include a first wiring structure IS1 that includes a first wiring insulation film 140, contacts 141 and 144, first wiring patterns 145, 146, 147 and 148, and vias 149.

The first wiring insulation film 140 may be formed on the first side 110*a* of the first substrate 110. For example, the first wiring insulation film 140 may cover the first side 110*a* of the first substrate 110. The first substrate 110 and the first wiring insulation film 140 may form the first semiconductor chip 100. In FIG. 5, although the first wiring insulation film 140 is shown to be separated into one layer, example embodiments are not limited thereto. The illustrated number of layers of the first wiring insulation film 140 is provided as an example.

The first wiring insulation film 140 may include, for example, but is not limited to, at least one of silicon oxide, silicon nitride, silicon oxynitride, and low dielectric constant (low-k) material having a lower dielectric constant than silicon oxide.

The contacts 141 and 144, the first wiring patterns 145, 146, 147 and 148, and vias 149 which connect the first wiring patterns 145, 146, 147 and 148 may be provided inside the first wiring insulation film 140. The contacts 141 and 144 may electrically connect the first transistors TR1, the floating diffusion region FD, and the first wiring patterns 145, 146, 147 and 148. Some of the first wiring patterns 145, 146, 147, and 148 may be connected to the first connecting structure 450, but example embodiments are not limited thereto.

Each of the first wiring patterns 145, 146, 147 and 148, the contacts 141 and 144, the vias 149 may include, for example, but is not limited to, at least one of, tungsten (W), copper (Cu), aluminum (Al), gold (Au), silver (Ag) and alloys thereof.

The second substrate 210 may be bulk silicon or silicon-on-insulator (SOI). The second substrate 210 may be a silicon substrate or may include other materials, for example, silicon germanium, indium antimonide, lead tellurium compounds, indium arsenic, indium phosphide, gallium arsenide or gallium antimonide. Alternatively, the second substrate 210 may have an epitaxial layer formed on the base substrate.

The second substrate 210 may include an upper side and a lower side. An upper side 210*a* of the second substrate 210 may be a side that faces the first semiconductor chip 100.

A plurality of second transistors TR2 may be formed on the upper side 210*a* of the second substrate 210. The second transistors TR2 may be, for example, logic circuits. The second transistors TR2 may control the transfer transistor TX, the reset transistor RX, the selection transistor AX, the source follower transistor SX, and the dual conversion transistor DCX.

A second wiring structure IS2 including a second wiring insulation film 240, contacts 241, second wiring patterns 245 and 246, and vias 249 may be formed on the second substrate 210.

The second wiring insulation film 240 may cover the upper side 210*a* of the second substrate 210. The second substrate 210 and the second wiring insulation film 240 may form the second semiconductor chip 200. The second wiring insulation film 240 may include, for example, but is not limited to, at least one of silicon oxide, silicon nitride, silicon oxynitride, and low dielectric constant (low-k) materials having a lower dielectric constant than silicon oxide.

The second wiring patterns 245 and 246 may be provided inside the second wiring insulation film 240. The second wiring patterns 245 and 246 may each be connected to the second transistor TR2 through the contacts 241, and may be connected to the floating diffusion region FD of the first semiconductor chip 100. Some of the second wiring patterns 245 and 246 may be connected to the first connecting structure 450. Further, some other parts of the second wiring patterns 245 and 246 may be connected to the second connecting structure 550. However, example embodiments are not limited thereto.

The second wiring patterns 245 and 246, the contacts 241 and the vias 249 may each include, for example, but are not limited to, at least one of tungsten (W), copper (Cu), aluminum (Al), gold (Au), silver (Ag) and alloys thereof.

The surface insulating film 150 may be formed on the second side 110*b* of the first substrate 110. The surface insulating film 150 may extend along the second side 110*b* of the first substrate 110. In some example embodiments, at least a part of the surface insulating film 150 may come into contact with the pixel isolation pattern 120.

The surface insulating film 150 may include an insulating material. For example, the surface insulating film 150 may include, but is not limited to, silicon oxide, silicon nitride, silicon oxynitride, aluminum oxide, hafnium oxide, and a combination thereof.

The surface insulating film 150 may function as an anti-reflection film to prevent the reflection of light incident on the first substrate 110, thereby improving the light-receiving rate of the photoelectric conversion layer PD. Further, the surface insulating film 150 may function as a flattening film to form a first color filter 170 and a microlens 180, which will be described later, at a uniform height.

The first color filter 170 may be formed on the surface insulating film 150 of the light-receiving region APS. In some example embodiments, the first color filters 170 may be arranged to correspond to each unit pixel PX. For example, a plurality of first color filters 170 may be arranged two-dimensionally (for example, in the form of a matrix).

The first color filter 170 may have various color filters depending on the pixel region PX. For example, the first color filter 170 may be arranged in a Bayer pattern that includes a red color filter, a green color filter, and a blue color filter. However, this is only an example, the first color filter 170 may include a yellow filter, a magenta filter and a cyan filter, and may further include a white filter.

A grid pattern 160 may be formed on the surface insulating film 150. The grid pattern 160 may be formed in a grid shape from a planar viewpoint, and may be interposed between the plurality of first color filters 170.

The grid pattern 160 may include a low refractive index substance having a lower refractive index than silicon (Si). For example, the grid pattern 160 may include, but is not limited to, at least one of silicon oxide, aluminum oxide, tantalum oxide, and a combination thereof. The grid pattern 160 including the low refractive index substance may improve the quality of the image sensor, by refracting or reflecting the light which is obliquely incident on the image sensor.

In some example embodiments, a first protective film 165 may be formed on the surface insulating film 150 and the grid pattern 160. The first protective film 165 may be interposed between the surface insulating film 150 and the first color filter 170, and between the grid pattern 160 and the first color filter 170. For example, the first protective film 165 may extend along the profiles of the upper side of the surface insulating film 150, and the side faces and upper side of the grid pattern 160.

The first protective film 165 may include, for example, but is not limited to, aluminum oxide. The first protective film 165 may prevent damage to the surface insulating film 150 and the grid pattern 160.

The microlens 180 may be formed on the first color filter 170. The microlens 180 may be arranged to correspond to each unit pixel. For example, the microlens 180 may be arranged two-dimensionally (for example, in the form of a matrix) in the plane.

The microlens 180 has a convex shape, and may have a predetermined radius of curvature. Accordingly, the microlens 180 may concentrate the light which is incident on the photoelectric conversion layer PD. The microlens 180 may include, for example, but is not limited to, a light-transmitting resin.

In some example embodiments, a second protective film 185 may be formed on the microlens 180. The second protective film 185 may extend along the surface of the microlens 180. The second protective film 185 may include, for example, an inorganic oxide film. For example, the second protective film 185 may include, but is not limited to, at least one of silicon oxide, titanium oxide, zirconium oxide, hafnium oxide, and a combination thereof. In some example embodiments, the second protective film 185 may include a low temperature oxide (LTO).

The second protective film 185 may protect the microlens 180 from the outside. For example, the second protective film 185 may protect the microlens 180 including an organic substance, by including an inorganic oxide film. Also, the second protective film 185 may improve the light concentration capability of the microlens 180. For example, the second protective film 185 may reduce reflection, refraction, scattering, or the like of incident light that reaches a space between the microlenses 180, by filings the space between the microlenses 180.

The image sensor according to some example embodiments may further include a first connecting structure 450 and a second connecting structure 550.

The first connecting structure 450 may be formed inside the light-shielding region OB. The first connecting structure 450 may be formed on the surface insulating film 150 of the light-shielding region OB. The first connecting structure 450 may come into contact with the pixel isolation pattern 120. For example, a first trench that exposes the pixel isolation pattern 120 may be formed inside the first substrate 110 and the surface insulating film 150 of the light-shielding region OB. The first connecting structure 450 may be formed inside the first trench and may come into contact with the pixel isolation pattern 120 in the light-shielding region OB. The first connecting structure 450 may extend along profiles of the side face and bottom side of the first trench.

The first connecting structure 450 may be electrically connected to the first isolation pattern 120. For example, the first connecting structure 450 may be electrically connected to the first isolation pattern 120. The first connecting structure 450 may include, for example, a titanium (Ti) film, a titanium nitride (TiN) film, and a tungsten (W) film that are sequentially stacked.

In some example embodiments, a first pad pattern 455 that fills the first trench may be formed on the first connecting structure 450. The first pad pattern 455 may include, for example, but is not limited to, at least one of tungsten (W), copper (Cu), aluminum (Al), gold (Au), silver (Ag), and alloys thereof.

In some example embodiments, the first protective film 165 may cover the first connecting structure 450 and the first pad pattern 455. For example, the first protective film 165 may extend along the profiles of the first connecting structure 450 and the first pad pattern 455.

In some example embodiments, a second color filter 170C may be formed on the first connecting structure 450. For example, the second color filter 170C may be formed to cover a part of the first protective film 165 inside the light-shielding region OB. The second color filter 170C may include, for example, but is not limited to, a blue color filter.

In some example embodiments, a third protective film 480 may be formed on the second color filter 170C. In some example embodiments, the second protective film 185 may extend along the surface of the third protective film 480. The third protective film 480 may include, for example, but is not limited to, a light-transmitting resin. In some example embodiments, the third protective film 480 may include the same material as the microlens 180.

The second connecting structure 550 may be formed in the pad region PR. The second connecting structure 550 may be formed on the surface insulating film 150 of the pad region PR. The second connecting structure 550 may be electrically connected to an external device or the like.

For example, a second trench that exposes the second wiring pattern 243 may be formed inside the first semiconductor chip 100 and the second semiconductor chip 200 of the pad region PR. The second connecting structure 550 may be formed in the second trench and may come into contact with the second wiring pattern 243. Further, a third trench may be formed inside the first substrate 110 of the pad region PR. The second connecting structure 550 may be formed in the third trench and exposed. In some example embodiments, the second connecting structure 550 may extend along profiles of the side face and bottom face of the second trench and the third trench.

In some example embodiments, a filling insulation film 560 that fills the second trench may be formed on the second connecting structure 550. The filling insulation film 560 may include, for example, but is not limited to, at least one of silicon oxide, aluminum oxide, tantalum oxide, and combinations thereof.

In some example embodiments, a second pad pattern 555 that fills the third trench may be formed on the second connecting structure 550. The second pad pattern 555 may include, for example, but is not limited to, at least one of tungsten (W), copper (Cu), aluminum (Al), gold (Au), silver (Ag), and alloys thereof. The second connecting structure 550 may include a titanium (Ti) film, a titanium nitride (TiN) film, and a tungsten (W) film that are sequentially stacked inside the second trench.

In some example embodiments, the second protective film 185 and the third protective film 580 may expose the second pad pattern 555. For example, an exposure opening ER that exposes the second pad pattern 555 may be formed inside the second protective film 185 and the third protective film 580. Therefore, the second pad pattern 555 may be connected to an external device or the like and configured to transmit and receive electrical signals between the image sensor according to some example embodiments and the external device.

Figure 7:
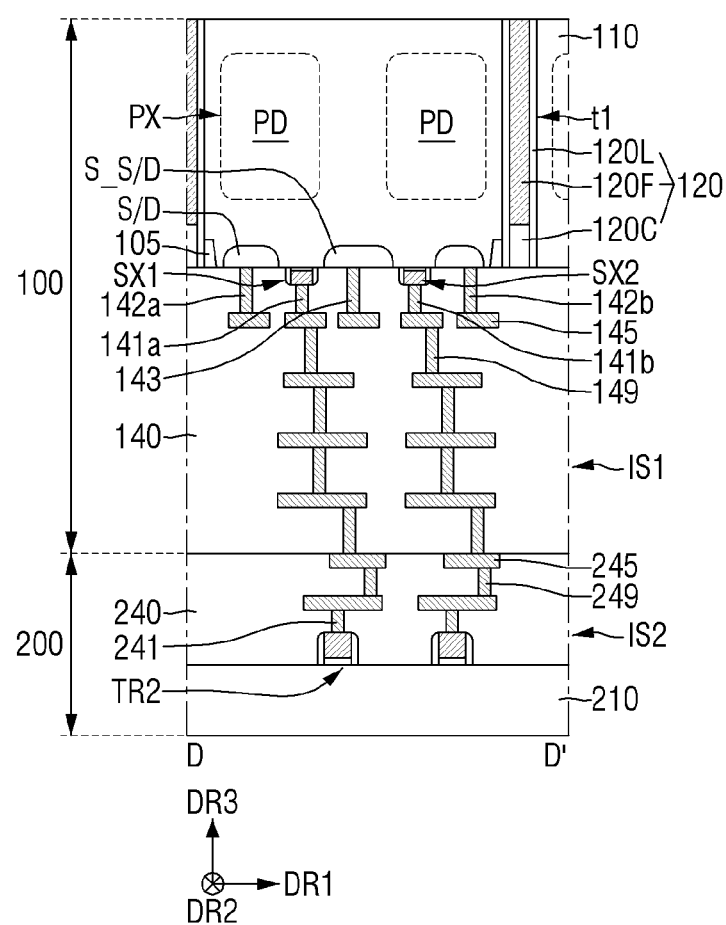
FIG. 7 is a cross-sectional view taken along line D-D' of FIG. 6.
Figure 8A:
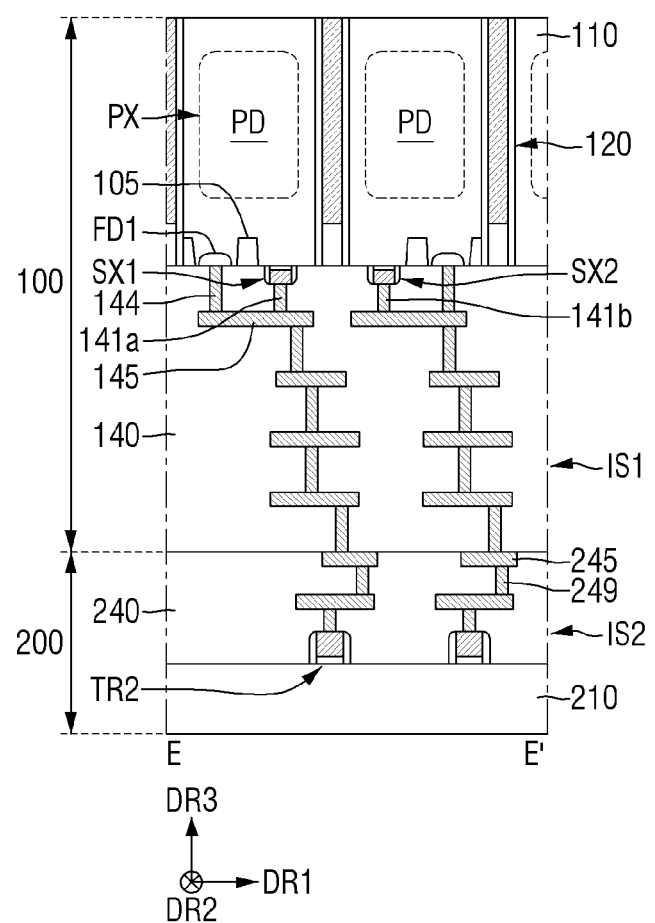
FIG. 8A is a cross-sectional view taken along a line E-E' of FIG. 6.

FIG. 6 is a layout diagram which shows schematically the unit pixel region of the image sensor according to some example embodiments. FIG. 7 is a cross-sectional view taken along line D-D' of FIG. 6. FIG. 8A is a cross-sectional view taken along a line E-E' of FIG. 6.

Hereinafter, an image sensor according to some example embodiments will be described in more detail referring to FIGS. 6 to 8A.

Referring to FIGS. 6 to 8A, the element isolation patterns 105 in the first substrate 110 may define the active region ACT. For convenience of explanation, the description of the surface insulating film 150, the grid pattern 160, the first protective film 165, the first color filter 170, the microlens 180, and the second protective film 185 may be omitted.

From a planar viewpoint, the active regions ACT may have the form of a line extending in the second direction DR2. However, the shape of the active regions ACT is not limited to the form shown in FIG. 6, and may be changed in various ways.

Referring to FIGS. 3 and 6, first and second floating diffusion regions FD1 and FD2, first to eighth transfer transistors TX1 to TX8, a selection transistor AX, a reset transistor RX, first to third source follower transistors SX1, SX2 and SX3, and a dual conversion transistor DCX may be provided on the active regions ACT.

The first to eighth transfer transistors TX1 to TX8 include the first to eighth transfer gates TG1 to TG8, the selection transistor AX includes the selection gate SEL, the first to third source follower transistors SX1, SX2, and SX3 include the first to third source follower gates SF1, SF2 and SF3, and the dual conversion transistor DCX may include the dual conversion gate DCG. However, the placement and number of transistors included in the pixel region PX are not limited to those shown in FIGS. 3 and 6.

In FIG. 6, the first floating diffusion region FD1 may be provided on one side of the first to eighth transfer gates TG1 to TG8. Each of the first to eighth transfer gates TG1 to TG8 and the first floating diffusion region FD1 may be arranged to face each other in the second direction DR2. The first floating diffusion region FD1 may have a conductive type opposite to that of the first substrate 110. For example, an n-type impurity may be doped in the first floating diffusion region FD1. However, example embodiments are not limited thereto.

Referring to FIGS. 3 and 6, each of the first to third pixel regions PX1, PX2, and PX3 may include the first to third transfer transistors TX1, TX2, and TX3, the first floating diffusion region FD1, and the first to third source follower transistors SX1, SX2, and SX3.

Referring to FIGS. 6 and 7, the first to third source follower transistors SX1, SX2, and SX3 may share one source/drain region S_S/D inside the active region ACT. The shared source/drain region S_S/D may be provided between the plurality of adjacent pixel regions PX. From a planar viewpoint, the shared source/drain regions S_S/D of the first to third source follower transistors SX1, SX2, and SX3 may be connected to each other by the active region ACT formed radially inside the first substrate 110.

On the other hand, the shared source/drain region S_S/D may not be electrically connected to the fourth pixel region PX4 due to the element isolation pattern 105. However, example embodiments are not limited thereto.

In some example embodiments, the pixel isolation pattern 120 may define the pixel regions PX. For example, the pixel isolation pattern 120 may be provided between the pixel regions PX. From a planar viewpoint, the pixel isolation pattern 120 may have a grid structure. From a planar viewpoint, the pixel isolation pattern 120 may completely surround each pixel region PX. The pixel isolation pattern 120 may have a grid structure extending in the first direction DR1 and the second direction DR2.

The pixel isolation pattern 120 may penetrate the first substrate 110 in the third direction DR3 perpendicular to the first and second sides 110a and 110b of the first substrate 110. However, referring to FIGS. 6 and 7, the shared source/drain region S_S/D may not overlap the pixel isolation pattern 120 between the plurality of pixel regions PX in third direction DR3. This may be a structure caused by removal of the pixel isolation pattern 120 of the region in which the shared source/drain region S_S/D is formed. The shared source/drain region S_S/D may be merged through the active region ACT in the region from which the pixel isolation pattern 120 is removed.

Referring to FIG. 7, in some example embodiments, the pixel isolation pattern 120 may include a liner film 120L, a first conductive layer 120F, and a capping film 120C. The liner film 120L may be provided along the side wall and the bottom side of a pixel isolation trench t1. The first conductive layer 120F may be provided on the liner film 120L. The capping film 120C may be provided on the first conductive layer 120F.

The liner film 120L may include, but is not limited to, at least one of silicon oxide, aluminum oxide, tantalum oxide, and combinations thereof. The first conductive layer 120F may include a conductive material. The first conductive layer 120F may include, but is not limited to, polysilicon (poly Si). The capping film 120C may include an insulating material. The capping film 120C may include a silicon-based insulating material and a high-dielectric material.

In some example embodiments, the image sensor may include a gate contact 141 connected to the gates of the transistors of each pixel region PX, and source/drain contacts 142 and 143 connected to the source/drain regions of each transistor. The gate contact 141 and the source/drain contacts 142 and 143 may be provided on the above-mentioned upper plate.

Referring to FIGS. 6 and 7, a source/drain region S/D of the first source follower transistor SX1 may be connected to the first wiring pattern 145 of the first wiring structure IS1 through the first source/drain contact 142a. The source/drain region S/D of the second source follower transistor SX2 may be connected to the first wiring pattern 145 of the first wiring structure IS1 through the second source/drain contact 142b.

The shared source/drain region S_S/D may be connected to the first wiring pattern 145 of the first wiring structure IS1 through the single shared source/drain contact 143. In this case, the non-shared source/drain region S/D may be provided on one side of each of the first to third source follower transistors SX1, SX2, and SX3, and the shared source/drain region S_S/D may be provided on each of other sides of the first to third source follower transistors SX1, SX2, and SX3.

According to some example embodiments, in an image sensor including a plurality of transistors, one of the source region and the drain region of the source follower transistors may be shared between the source follower transistors. As a result, because the number of contacts connected to the source region or the drain region may be reduced, an image sensor with improved performance may be provided, while securing the area of the transistor.

Referring to FIG. 6, from a planar viewpoint, the gate contacts 141a, 141b, and 141c of each of the first to third source follower transistors SX1, SX2, and SX3 may have a rectangular shape. However, example embodiments are not limited thereto and the gate contacts may have a different shape, such as a triangular shape.

A distance between the gate contact 141a of the first source follower transistor SX1 and the shared source/drain contact 143 may be the same as a distance between the gate contact 141b of the second source follower transistor SX2 and the shared source/drain contact 143, and a distance between the gate contact 141c of the third source follower transistor SX3 and the shared source/drain contact 143. However, example embodiments are not limited thereto, and the distances between the gate contacts 141a, 141b, and 141c of each of the first to third source follower transistors SX1, SX2, and SX3 and the shared source/drain contact 143 may differ from each other.

Further, from a planar viewpoint, the width in the active region ACT in which the non-shared source/drain regions S/D of each of the first to third source follower transistors SX1, SX2, and SX3 are formed may differ from the width of the region in the active region ACT connected to the shared source/drain region S_S/D.

For example, referring to FIG. 6, the width W1 of the active region ACT in which the shared source/drain region S_S/D of the first source follower transistor SX1 is formed may be greater than the width W2 of the region in the active region ACT connected to the non-shared source/drain region S/D. In this case, in each of the source follower transistors SX1, SX2, and SX3, the non-shared source/drain regions S/D and the shared source/drain region S_S/D may be formed asymmetrically. However, example embodiments are not limited thereto.

Referring to FIGS. 6 and 8A, the first to third source follower transistors SX1, SX2, and SX3 may be connected to the first floating diffusion region FD1 through the first wiring structure IS1.

The first floating diffusion region FD1 provided in the first pixel region PX1, the first floating diffusion region FD1 provided in the second pixel region PX2, and the first floating diffusion region FD1 provided in the third pixel region PX3 may be electrically connected to each other through the first wiring structure IS1.

The first floating diffusion region FD1 of the first pixel region PX1 and the first source follower transistor SX1 may be electrically connected to the first wiring pattern 145 through each of the contacts 144 and 141a.

The first source follower transistor SX1 of the first pixel region PX1 and the second source follower transistor SX2 of the second pixel region PX2 may be electrically connected to the first wiring pattern 145 through each of the gate contacts 141a and 141b.

The first floating diffusion region FD1 of the second pixel region PX2 and the second source follower transistor SX2 may electrically connected to the first wiring pattern 145 through each of the contacts 144 and 141b.

The first floating diffusion region FD1 of the second pixel region PX2 and the first floating diffusion region FD1 of the fourth pixel region PX4 may be electrically connected to each other through the first wiring structure IS1.

The source/drain region S/D of the first source follower transistor SX1, the source/drain region S/D of the second source follower transistor SX2, and the source/drain region S/D of the third source follower transistor SX3 may be electrically connected to each other through the first wiring structure IS1. In this case, each source/drain region S/D may be electrically connected by a wiring pattern located on a layer different from the first wiring pattern 145 in the first wiring structure IS1. However, example embodiments are not limited thereto.

The reset transistor RX and the shared source/drain region S_S/D may be electrically connected to each other through the shared source/drain contact 143 and the first wiring structure IS1. In this case, the drain region and the shared source/drain region S_S/D of the reset transistor RX may be connected to each other through the active region ACT.

The second floating diffusion region FD2 may be provided between the reset transistor RX and the dual conversion transistor DCX, and may be electrically connected to them. The second floating diffusion region FD2 may be connected to the first capacitor C1 for adjustment of the above-mentioned combined capacitance.

In this case, the second floating diffusion region FD2 may be connected to the dual conversion transistor DCX, the reset transistor RX, and the first capacitor C1 through the active region ACT. However, example embodiments are not limited thereto.

In some example embodiments, each of the source/drain region S/D of the first source follower transistor SX1, the source/drain region S/D of the second source follower transistor SX2, and the source/drain region S/D of the third source follower transistor SX3 may be a source region, and the shared source/drain region S_S/D may be a drain region.

However, example embodiments are not limited thereto, and each of the source/drain region S/D of the first source follower transistor SX1, the source/drain region S/D of the second source follower transistor SX2, and the source/drain regions S/D of the third source follower transistor SX3 may be a drain region, and the shared source/drain region S_S/D may be a source region.

Figure 8B:
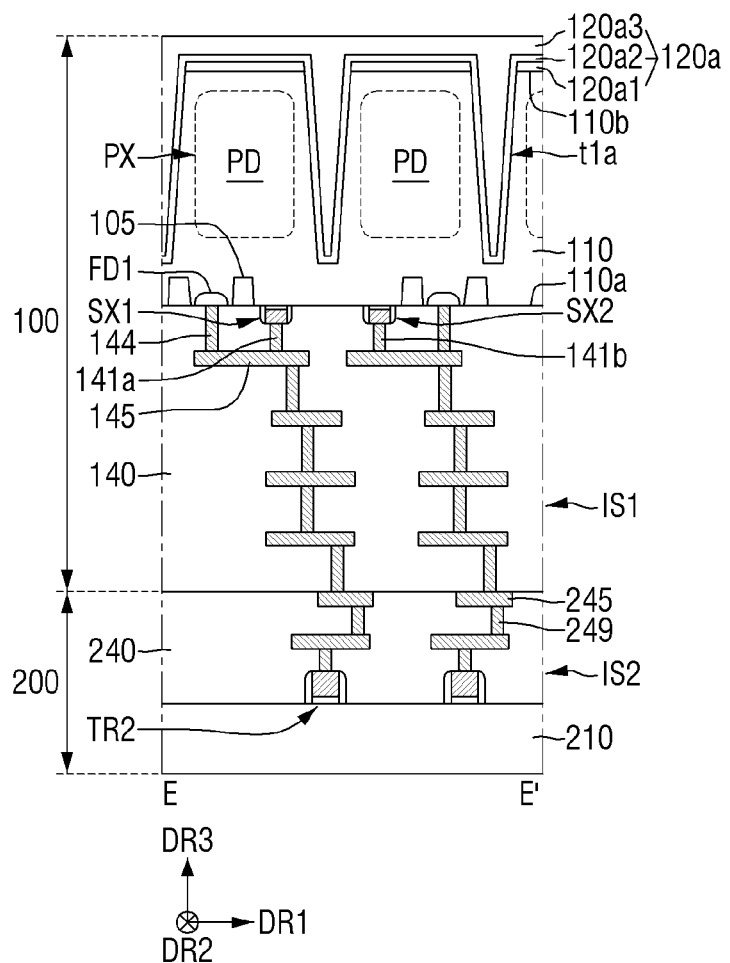
FIG. 8B is a diagram which shows an image sensor according to some example embodiments, and corresponds to the cross-sectional view taken along the line E-E' of FIG. 6.

FIG. 8B is a diagram which shows an image sensor according to some example embodiments, and corresponds to the cross-sectional view taken along the line E-E' of FIG. 6. For convenience of explanation, points different from those described using FIGS. 1 to 8A will be mainly described.

Referring to FIG. 8B, the pixel isolation pattern 120a penetrates the second side 110b of the substrate 110 and may be spaced apart from the first side 110a. Such a pixel isolation pattern 120a may be backside deep trench isolation (BDTI).

The pixel isolation pattern 120a may include a first insulating layer 120a1, a second insulating layer 120a2, and a third insulating layer 120a3.

The first insulating layer 120a1 may be conformally formed on the second side 110b of the first substrate 110, for example, the surface on which light is incident on the photoelectric conversion layer PD. The first insulating layer 120a1 may include metal oxides having a high dielectric constant (high-k) such as hafnium oxide ($HfO_2$), hafnium oxide ($Hf_xSi_yO_z$) layer, titanium oxide ($TiO_2$), zirconium oxide ($ZrO_2$), magnesium oxide (MgO), tantalum oxide ($Ta_2O_5$), scandium oxide ($Sc_2O_3$), ruthenium oxide ($Lu_2O_3$), yttrium oxide ($Y_2O_3$), and lanthanum oxide ($La_2O_3$).

The second insulating layer 120a2 may be conformally formed along the upper side and the side face of the first insulating layer 120a1, and the side wall and the bottom side of a pixel isolation trench t1a. The pixel isolation trench t1a may extend from the second side 110b of the first substrate 110 to the part between the photoelectric conversion layers PD to separate and define the photoelectric conversion layers PD. For example, the second insulating layer 120a2 may include an electron-rich metal oxide such as an aluminum oxide ($Al_2O_3$).

The first and second insulating layers 120a1 and 120a2 may be fixed charge films. In this case, dark current, dark level defects, white spot defects, and the like are prevented, and the photoelectric conversion characteristics of the photoelectric conversion layer PD may be improved.

Further, the first insulating layer 120a1 may be an anti-reflection layer. In this case, the first insulating layer 120a1 may prevent the light incident on the photoelectric conversion layer PD from being reflected from the surface of the first substrate 110.

The third insulating layer 120a3 may be formed on the second insulating layer 120a2 and may fill the pixel isolation trench t1a. The third insulating layer 120a3 may be thicker than the first and second insulating layers 120a1 and 120a2. The third insulating layer 120a3 may include an insulating material such as silicon oxide ($SiO_2$). The third insulating layer 120a3 may have a lower dielectric constant and excellent filling characteristics than the first and second insulating layers 120a1 and 120a2.

The first color filter 170 and the microlens 180 may be formed on the third insulating layer 120a3.

Figure 9:
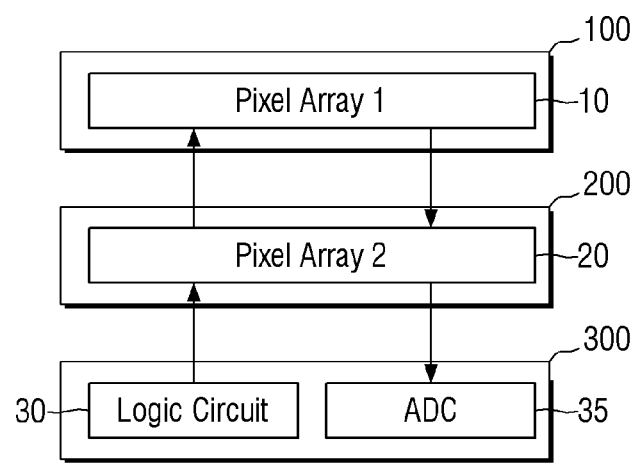
FIG. 9 is a block diagram of an image sensor according to some example embodiments.
Figure 10:
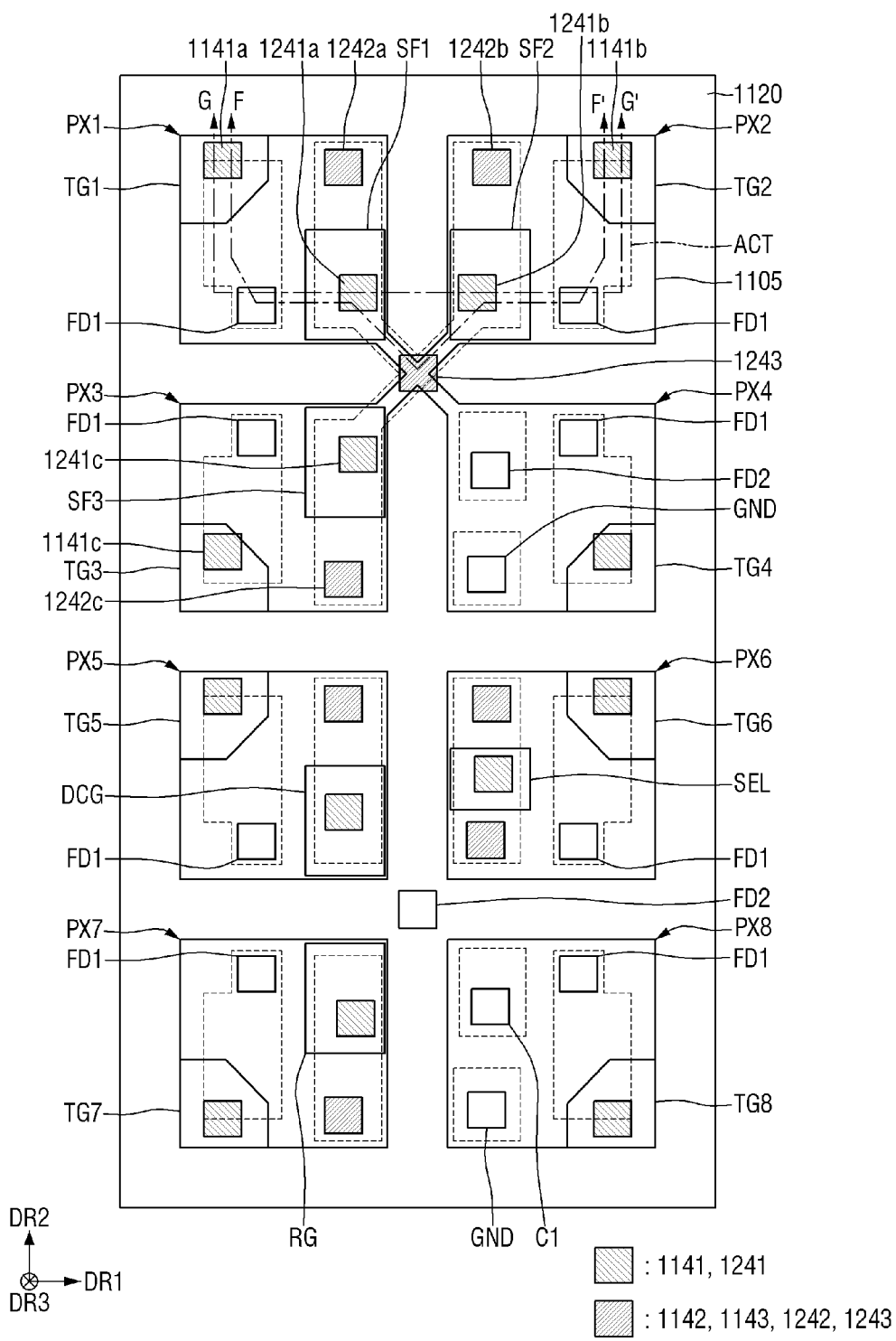
FIG. 10 is a layout diagram which shows schematically a unit pixel region of an image sensor according to some example embodiments.
Figure 11:
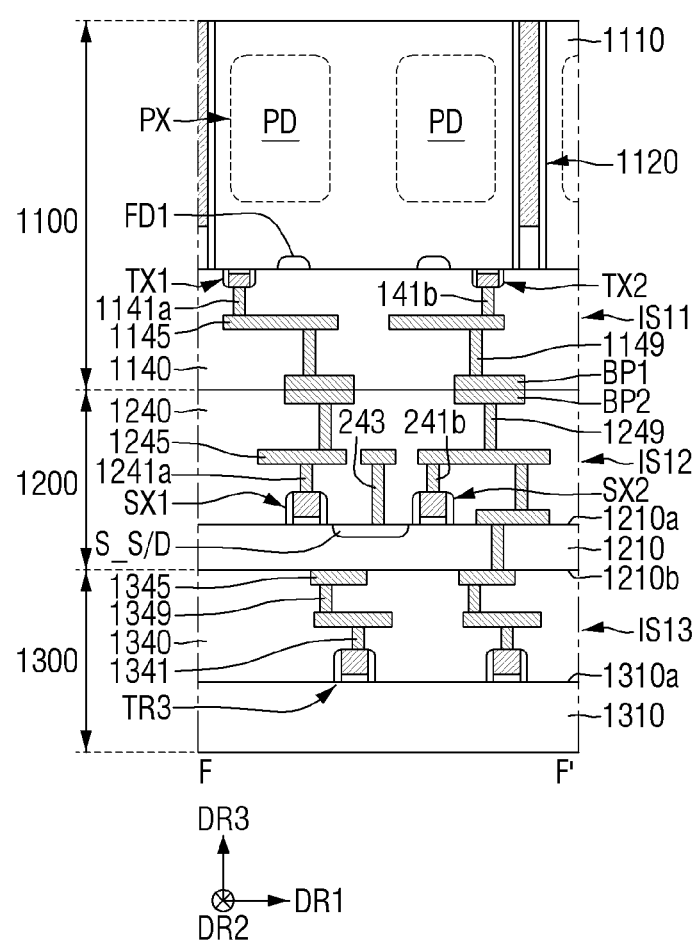
FIG. 11 is a cross-sectional view taken along the line F-F' of FIG. 10.
Figure 12:
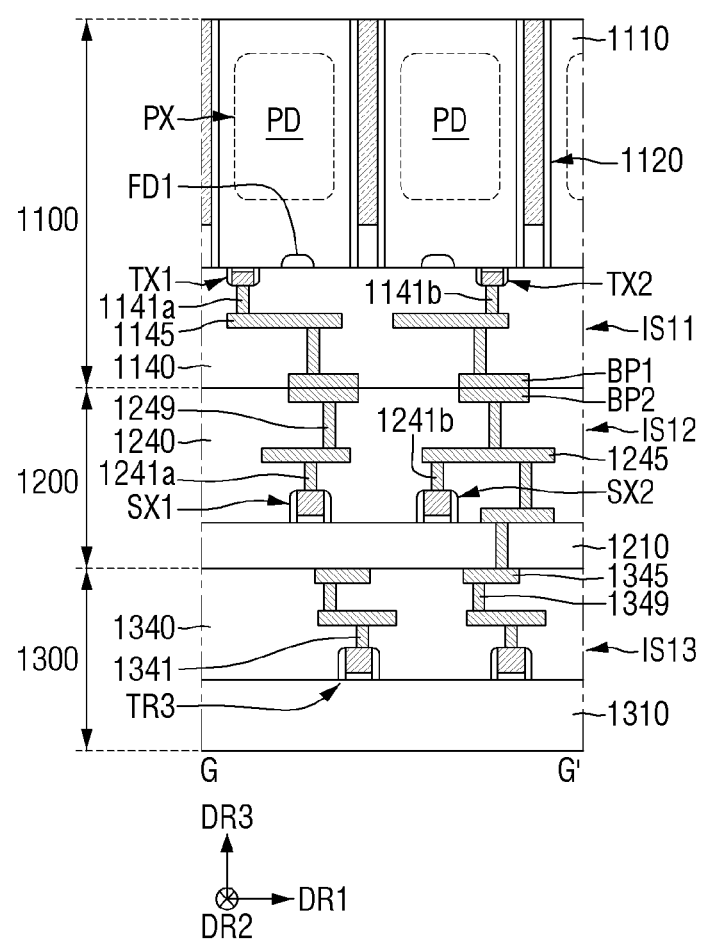
FIG. 12 is a cross-sectional view taken along the line G-G' of FIG. 10.

FIG. 9 is a block diagram of an image sensor according to some example embodiments. FIG. 10 is a layout diagram which shows schematically the unit pixel region of the image sensor according to some example embodiments. FIG. 11 is a cross-sectional view taken along the line F-F' of FIG. 10. FIG. 12 is a cross-sectional view taken along the line G-G' of FIG. 10. For convenience of explanation, points different from those described using FIGS. 1 to 8 will be mainly described and the description of the element isolation pattern 105 may be omitted.

Referring to FIG. 9, the image sensor according to some example embodiments may include a first semiconductor chip 1100, a second semiconductor chip 1200, and a third semiconductor chip 1300. The first semiconductor chip 1100, the second semiconductor chip 1200, and the third semiconductor chip 1300 may be arranged to overlap each other from a planar viewpoint. The first semiconductor chip 1100, the second semiconductor chip 1200, and the third semiconductor chip 1300 may be sequentially stacked in the vertical direction. The first semiconductor chip 1100 may be referred to as an upper plate, the second semiconductor chip 1200 may be referred to as an intermediate plate, and the third semiconductor chip 1300 may be referred to as a lower plate.

According to some example embodiments, the first semiconductor chip 1100 and the second semiconductor chip 1200 may be formed on a single chip. A semiconductor chip including a pixel array and a semiconductor chip including a logic circuit may be stacked each other.

The image sensor according to some example embodiments may be a 3-stack image sensor which includes the first pixel array 10 and the second pixel array 20, and in which the first pixel array 10 and the second pixel array 20 are formed on different chips from each other and stacked. In FIG. 9, the first and second pixel arrays 10 and 20 may be implemented on the first and second semiconductor chips 1100 and 1200, and the logic circuit 30 may be implemented on the third semiconductor chip 1300.

In this case, the photoelectric conversion layer PD and the transfer transistor TX of FIG. 10 may be formed on the first semiconductor chip 100, and the reset transistor RX, the source follower transistor SX, the selection transistor AX and the dual conversion transistor DCX may be formed on the second semiconductor chip 1200. The first semiconductor chip 1100 and the second semiconductor chip 1200 may be aligned to form a unit pixel.

Referring to FIGS. 11 and 12, the first transfer transistor TX1 may be connected to the first wiring pattern 1145 of the first wiring structure IS11 through the gate contact 1141a. The second transfer transistor TX2 may be connected to the first wiring pattern 1145 of the first wiring structure IS11 through the gate contact 1141b.

The first bonding pad BP1 may be provided inside the first wiring insulation film 1140. One side of the first bonding pad BP1 may be exposed on the first wiring insulation film 1140. The lower side of the first bonding pad BP1 may be located on the same plane as the lower side of the first wiring insulation film 1140. The first bonding pad BP1 may be bonded to a second bonding pad BP2 to be described later. The first wiring insulation film 1140 and the second wiring insulation film 1240 may be bonded to each other, using the first bonding pad BP1 and the second bonding pad BP2.

The second substrate 1210 may be bulk silicon or silicon-on-insulator (SOT). The second substrate 1210 may be a silicon substrate or may include other materials, for example, silicon germanium, indium antimonide, lead tellurium compounds, indium arsenic, indium phosphide, gallium arsenide or gallium antimonide. Alternatively, the second substrate 210 may have an epitaxial layer formed on the base substrate.

The second substrate 1210 may include a third side 1210b and a fourth side 1210a. The fourth side 1210a of the second substrate 1210 may be a surface that faces the first semiconductor chip 1100. The third side 1210b of the second substrate 1210 may be a surface that faces the fourth side 1210a of the second substrate 1210.

The source follower transistors SX may be formed on the fourth side 1210a of the second substrate 1210. The source follower transistors SX may be electrically connected to the floating diffusion region FD of the first semiconductor chip 1100.

The second wiring structure IS12 may be formed on the second substrate 1210. For example, the second wiring structure IS12 may cover the fourth side 1210a of the second substrate 1210. The second substrate 1210 and the second wiring structure IS12 may form the second semiconductor chip 1200.

The second wiring structure IS12 may be attached to the first wiring structure IS11. For example, the upper side of the second wiring structure IS12 may be attached to the lower side of the first wiring structure IS11. Specifically, the lower side of the first wiring insulation film 1140 and the upper side of the second wiring insulation film 1240 may be bonded to each other.

The second wiring structure IS12 may include a second wiring insulation film 1240, and second wiring patterns 1245, contacts 1241a, 1241b and 1243 and second bonding pads BP2 provided inside the second wiring insulation film 1240. In FIGS. 11 and 12, the number of layers of the wiring pattern constituting the second wiring structure IS12 and the placement thereof are provided as examples, and example embodiments are not limited thereto.

The second wiring insulation film 1240 may include, for example, but is not limited to, at least one of silicon oxide, silicon nitride, silicon oxynitride, and low dielectric constant (low-k) materials having a lower dielectric constant than silicon oxide.

In some example embodiments, the image sensor may include a gate contact 1241 connected to the gates of the transistors of each pixel region PX, and source/drain contacts 1242 and 1243 connected to the source/drain region of each transistor. The gate contact 1241 and the source/drain contacts 1242 and 1243 may be provided on the above-mentioned intermediate plate.

Referring to FIG. 10, the source/drain region S/D of each of the first to third source follower transistors SX1, SX2, and SX3 may be connected to contacts 1242a, 1242b, and 1242c provided on the second substrate 1210.

Referring to FIGS. 10 and 11, the first source follower gate SF1 of the first source follower transistor SX1 may be connected to the second wiring pattern 1245 through the gate contact 1241a. The second source follower gate SF2 of the second source follower transistor SX2 may be connected to the second wiring pattern 1245 through the gate contact 1241b. The third source follower gate SF3 of the third source follower transistor SX3 may be electrically connected to the second wiring structure IS12 through the gate contact 1241c.

The first to third source follower transistors SX1, SX2, and SX3 may be electrically connected to the floating diffusion region FD, using a plurality of contacts, a plurality of wiring patterns, and bonding pads.

Referring to FIG. 11, the first to third source follower transistors SX1, SX2, and SX3 may share one source/drain region S_S/D inside the active region ACT. The shared source/drain region S_S/D may be provided between a plurality of adjacent pixel regions PX. The shared source/drain region S_S/D may be connected to the second wiring pattern 1245 of the second wiring structure IS2 through the shared source/drain contact 1243.

The contacts 1241a, 1241b, and 1243, the second wiring patterns 1245, and the vias 1249 may each include, but are not limited to, at least one of tungsten (W), copper (Cu), aluminum (Al), gold (Au), silver (Ag), and alloys thereof.

The second bonding pad BP2 may be provided inside the second wiring insulation film 1240. In the second wiring insulation film 1240, one side of the second bonding pad BP2 may be exposed. The upper side of the second bonding pad BP2 may be located in the same plane as the upper side of the second wiring insulation film 1240. The second bonding pad BP2 may be bonded to the first bonding pad BP1. The first wiring insulation film 1140 and the second wiring insulation film 1240 may be bonded to each other, using the first bonding pad BP1 and the second bonding pad BP2.

The first and second bonding pads BP1 and BP2 may include, for example, but are not limited to, copper (Cu).

For example, some of the second wiring patterns 1245 may extend from the sensor array region SAR to the pad region PR. Some of the second wiring patterns 1245 may be electrically connected to the pad region PR. Some of the second wiring patterns 1245 may be connected to the third transistor TR3 through the through via TSV.

Referring to FIG. 11, the third substrate 1310 may include an upper side 1310a that faces the second semiconductor chip 1200. The third transistors TR3 may be formed on the upper side 1310a of the third substrate 1310. The third transistors TR3 may be, for example, the logic circuits of FIG. 9. The third transistors TR3 may be electrically connected to the transistors of the second semiconductor chip 1200.

The third wiring structure IS13 may be formed on the third substrate 1310. For example, the third wiring structure IS13 may cover the upper side 1310a of the third substrate 1310. The third substrate 1310 and the third wiring structure IS13 may form the third semiconductor chip 1300.

The third wiring structure IS13 may be attached to the second substrate 1210. For example, the third side 1210b of the second substrate 1210 may be attached to the upper side 1310a of the third wiring structure IS13.

The third wiring structure IS13 may include a third wiring insulation film 1340, contacts 1341, third wiring patterns 1345, and vias 1349.

In FIGS. 11 and 12, the number of layers of the wiring patterns constituting the third wiring structure IS3 and the placement thereof are provided as examples, and example embodiments are not limited thereto. The third wiring insulation film 340 may include, for example, but is not limited to, at least one of a silicon oxide, a silicon nitride, a silicon oxynitride, and a low-k material having a lower dielectric constant than silicon oxide.

The contacts 1341 may be connected to the third transistor TR3 and the third wiring patterns 1345. The third wiring patterns 1345, the contacts 1341, and the vias 1349 may include, for example, but are not limited to, at least one of tungsten (W), copper (Cu), aluminum (Al), gold (Au), silver (Ag), and alloys thereof.

While aspects of example embodiments have been particularly shown and described, it will be understood that various changes in form and details may be made therein without departing from the spirit and scope of the following claims.

What is claimed is:

1. An image sensor comprising:
   a first substrate comprising a first side and a second side opposite to each other, and an active region;
   a plurality of pixel regions, each comprising a photoelectric conversion layer on the first side of the first substrate;
   a pixel isolation pattern which separates the plurality of pixel regions from each other and extends along a direction perpendicular to the first side of the first substrate; and
   a first transistor, a second transistor and a third transistor corresponding to a first pixel region of the plurality of pixel regions,
   wherein the first transistor, the second transistor and the third transistor share a common source/drain region inside the active region, and a gate of each of the first transistor, the second transistor and the third transistor is connected to a floating diffusion region configured to store electric charges generated by the photoelectric conversion layer.

2. The image sensor of claim 1, wherein the common source/drain region is provided between pixel regions, among the plurality of pixel regions, that are adjacent to each other, and
   from a planar viewpoint, the active region extends radially to connect the common source/drain region to each of the first transistor, the second transistor and the third transistor.

3. The image sensor of claim 1, wherein the common source/drain region does not overlap the pixel isolation pattern between the plurality of pixel regions along the direction.

4. The image sensor of claim 1, further comprising a first wiring structure provided on the first side of the first substrate,
   wherein a first non-shared source/drain region of the first transistor is connected to the first wiring structure through a first source/drain contact,
   a second non-shared source/drain region of the second transistor is connected to the first wiring structure through a second source/drain contact, and
   the common source/drain region is connected to the first wiring structure through a common source/drain contact.

5. The image sensor of claim 4, wherein the floating diffusion region is provided on the first side of the first substrate, and
   wherein each of the first transistor, the second transistor and the third transistor is connected to the floating diffusion region through the first wiring structure.

6. The image sensor of claim 5, further comprising a reset transistor, a selection transistor, and a dual conversion transistor, each connected to the floating diffusion region on the first side of the first substrate.

7. The image sensor of claim 6, wherein the reset transistor is connected to the common source/drain region.

8. The image sensor of claim 4, wherein from a planar viewpoint, a first distance between a first gate contact of the first transistor and the common source/drain contact is equal to a second distance between a second gate contact of the second transistor and the common source/drain contact, and a third distance between a third gate contact of the third transistor and the common source/drain contact.

9. The image sensor of claim 4, wherein from a planar viewpoint, a first distance between a first gate contact of the first transistor and the common source/drain contact is different from a second distance between a second gate contact of the second transistor and the common source/drain contact.

10. The image sensor of claim 1, further comprising:
    a second substrate which is provided on the first side of the first substrate, and comprises a third side and a fourth side opposite to each other; and
    a reset transistor, a selection transistor, and a dual conversion transistor, each connected to the floating diffusion region on the first side of the first substrate,
    wherein the floating diffusion region is provided on the third side of the second substrate, and
    wherein the first transistor, the second transistor and the third transistor are provided on the first side of the first substrate and connected to the floating diffusion region.

11. The image sensor of claim 1, further comprising:
    a third substrate provided below the first transistor, the second transistor and the third transistor; and
    a logic circuit provided on the third substrate.

12. The image sensor of claim 1, wherein each of the first transistor, the second transistor and the third transistor is a source follower transistor.

13. An image sensor comprising:
a substrate comprising an element isolation region and an active region;
a plurality of pixel regions provided on the substrate, each comprising a photoelectric conversion layer, a floating diffusion region, a transfer transistor and a plurality of source follower transistors, wherein a gate of each of the plurality of source follower transistors is electrically connected to the floating diffusion region; and
a pixel isolation pattern that penetrates the substrate and separates the plurality of pixel regions from each other,
wherein source regions of the plurality of source follower transistors are respectively connected to a plurality of source contacts, and a common drain region shared by the plurality of source follower transistors is connected to a common drain contact.

14. The image sensor of claim 13, wherein a gate contact of each of the plurality of source follower transistors has a triangular shape from a planar viewpoint.

15. The image sensor of claim 13, wherein the common drain contact does not overlap the pixel isolation pattern between the plurality of pixel regions.

16. The image sensor of claim 13, further comprising a reset transistor connected to the floating diffusion region,
wherein a drain region of the reset transistor is connected to the common drain region.

17. An image sensor comprising:
a first substrate comprising a first side and a second side opposite to each other, and an active region;
pixels which are provided in the first substrate and comprise a photoelectric conversion layer, a floating diffusion region, and a transfer transistor configured to electrically connect the photoelectric conversion layer and the floating diffusion region;
a pixel isolation pattern that extends into the first substrate and separates each of the pixels from each other;
a microlens provided on the second side of the first substrate;
a second substrate provided on the first side of the first substrate, and comprising a fourth side facing the first side of the first substrate and a third side opposite to the fourth side;
a plurality of source follower transistors connected to the floating diffusion region, on the fourth side of the second substrate;
a third substrate provided on the third side of the second substrate; and
a plurality of logic circuits configured to control the plurality of source follower transistors on the third substrate,
wherein the plurality of source follower transistors share a common drain region inside the active region.

18. The image sensor of claim 17, wherein source regions of the plurality of source follower transistors are respectively connected to a plurality of source contacts, and a drain region shared by the plurality of source follower transistors is connected to a common drain contact.

19. The image sensor of claim 17, further comprising a selection transistor, a reset transistor, and a dual conversion transistor, each connected to the floating diffusion region.

20. The image sensor of claim 19, wherein a drain region of the reset transistor is connected to the common drain region inside the active region.

* * * * *